(12) United States Patent
Cheng et al.

(10) Patent No.: US 9,698,266 B1
(45) Date of Patent: Jul. 4, 2017

(54) SEMICONDUCTOR DEVICE STRAIN RELAXATION BUFFER LAYER

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/064,670

(22) Filed: Mar. 9, 2016

(51) Int. Cl.
　　*H01L 21/02* (2006.01)
　　*H01L 29/20* (2006.01)
　　*H01L 29/78* (2006.01)
　　*H01L 29/66* (2006.01)
　　*H01L 21/324* (2006.01)

(52) U.S. Cl.
　　CPC ...... *H01L 29/7849* (2013.01); *H01L 21/0245* (2013.01); *H01L 21/324* (2013.01); *H01L 29/66477* (2013.01)

(58) Field of Classification Search
　　CPC ............. H01L 29/7849; H01L 21/0245; H01L 21/324; H01L 29/66477
　　USPC ....................................................... 257/288
　　See application file for complete search history.

(56) References Cited

U.S. PATENT DOCUMENTS

| 6,906,400 | B2 | 6/2005 | Delhougne et al. |
| 7,060,632 | B2 | 6/2006 | Fitzgerald et al. |
| 8,766,364 | B2 | 7/2014 | Doornbos et al. |
| 2004/0075105 | A1* | 4/2004 | Leitz ........................ C30B 25/02 257/190 |
| 2012/0080686 | A1* | 4/2012 | Mauder ............... H01L 21/0237 257/76 |
| 2014/0285980 | A1* | 9/2014 | Cappellani .............. H01L 21/76 361/748 |
| 2015/0021697 | A1* | 1/2015 | Colinge ............. H01L 29/7848 257/368 |
| 2015/0050753 | A1 | 2/2015 | Srinivasan et al. |
| 2015/0079803 | A1 | 3/2015 | Huang et al. |

(Continued)

FOREIGN PATENT DOCUMENTS

WO　　2015038309 A1　　3/2015

OTHER PUBLICATIONS

Kangguo Cheng, et al., Pending U.S. Appl. No. 15/337,182 entitled "Semiconductor Device Strain Relaxation Buffer Layer," filed with the U.S. Patent and Trademark Office on Oct. 28, 2016.

(Continued)

*Primary Examiner* — Long K Tran
*Assistant Examiner* — Thai T Vuong
(74) *Attorney, Agent, or Firm* — Cantor Colburn LLP; Vazken Alexanian

(57) ABSTRACT

A method for forming a semiconductor device comprises forming a first buffer layer with a first melting point on a substrate. A second buffer layer is formed on the first buffer layer. The second buffer layer has a second melting point that is greater than the first melting point. Annealing process is performed that increases a temperature of the first buffer layer such that the first buffer layer partially liquefies and causes a strain in the second buffer layer to be substantially reduced.

15 Claims, 14 Drawing Sheets

(56) References Cited

U.S. PATENT DOCUMENTS

2015/0270344 A1* 9/2015 Cheng ................. H01L 29/161
   257/616
2015/0318355 A1   11/2015 Wang et al.

OTHER PUBLICATIONS

List of IBM Patents or Patent Applications Treated As Related; (Appendix P), Date Filed Oct. 31, 2016; 2 pages.
H. Yin et al., "Ultrathin strained-SOI by stress balance on compliant substrates and FET performance," IEEE Transactions on Electron Devices, vol. 52, No. 10, 2005, pp. 2207-2214.
R. L. Peterson et al., "Maximizing uniaxial tensile strain in large-area silicon-on-insulator islands on compliant substrates,." Journal of Applied Physics, vol. 100, No. 2, 2006, 023537, 9 pages.

* cited by examiner

SEMICONDUCTOR DEVICE STRAIN RELAXATION BUFFER LAYER

BACKGROUND

The present invention generally relates to complimentary metal-oxide semiconductors (CMOS) and metal-oxide-semiconductor field-effect transistors (MOSFET), and more specifically, to strain in semiconductor devices.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

Strain engineering is used to induce strain on the channel region of nFET and pFET devices. The strain may include a tensile strain or a compressive strain on the channel regions depending on the characteristics of the device. Crystalline materials such as crystalline silicon (c-Si) and crystalline silicon germanium (c-SiGe) are orientated in a lattice structure each with a different lattice constant (lattice parameter). Typically, during an epitaxial growth process where a seed layer has a lattice constant is different from the grown material layer; a strain is induced in the grown material layer. For example, when silicon is grown on a relaxed silicon germanium layer a tensile strain is induced in the grown silicon layer.

The finFET is a type of MOSFET. The finFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Since the fin provides a three dimensional surface for the channel region, a larger channel length may be achieved in a given region of the substrate as opposed to a planar FET device.

Gate spacers form an insulating film along the gate sidewalls. Gate spacers may also initially be formed along sacrificial gate sidewalls in replacement gate technology. The gate spacers are used to define source/drain regions in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions, which are determined by the wavelength of the irradiation.

SUMMARY

According to an embodiment of the present invention, a method for forming a semiconductor device comprises forming a first buffer layer on a substrate. The first buffer layer has a first melting point. A second buffer layer is formed on the first buffer layer. The second buffer layer has a second melting point that is greater than the first melting point. An annealing process is performed that increases a temperature of the first buffer layer such that the first buffer layer partially liquefies and causes a strain in the second buffer layer to substantially be reduced. The first buffer layer is cooled below the first melting point. A layer of a first semiconductor material is formed on the second buffer layer. A gate stack is then formed on the first semiconductor material.

According to another embodiment of the present invention, a semiconductor device comprises a first buffer layer arranged on a substrate, the first buffer layer having a first melting point. A second buffer layer is arranged on the first buffer layer, the second buffer layer has a second melting point. The second melting point is greater than the first melting point. An active region is arranged on the second buffer layer, and a gate stack is arranged on the active region.

According to yet another embodiment of the present invention, a method for forming an active region of a semiconductor device comprises forming a first buffer layer on a substrate. The first buffer layer has a first melting point. A second buffer layer is formed on the first buffer layer. The second buffer layer has a second melting point that is greater than the first melting point. An annealing process is performed that increases a temperature of the first buffer layer such that the first buffer layer partially liquefies and causes a strain in the second buffer layer to be substantially reduced.

According to yet another embodiment of the present invention, an active region of a semiconductor device comprises a first buffer layer arranged on a substrate. The first buffer layer has a first melting point. A second buffer layer is arranged on the first buffer layer. The second buffer layer has a second melting point that is greater than the first melting point. An active region is arranged on the second buffer layer.

BRIEF DESCRIPTION OF THE DRAWINGS

FIG. 1 illustrates a side view of a substrate that is formed from a first semiconductor material.

FIG. 2 illustrates a side view of the resultant structure following the formation of regions.

FIG. 3 illustrates a side view of the resultant structure following an annealing process, such as, for example, laser annealing that is performed at a temperature greater than the melting point of the first buffer layer.

FIG. 4 illustrates a side view after the annealing process where the first buffer layer (of FIG. 3) has cooled below the melting point of the first buffer layer.

FIG. 5 illustrates a side view of the resulting structure following the formation of a shallow trench isolation (STI) region.

FIG. 6 illustrates a side view following the formation of a mask over the region and the formation of a first active region in the region.

FIG. 7 illustrates a side view following the removal of the mask (of FIG. 6) and the formation of a second mask over the first active region.

FIG. 8 illustrates a side view following the formation of fins by removing portions of the first active region and the second active region.

FIG. 9 illustrates a top view of the fins arranged on the relaxed second buffer layers.

FIG. 10 illustrates a side view following the formation of an inter-level dielectric layer over exposed portions of the STI region and the relaxed second buffer layer.

FIG. 11 illustrates a side view of the resultant structure following the formation of sacrificial (dummy) gates over portions of the fins.

FIG. 12 illustrates a top view of the sacrificial gate and spacers arranged over the fins and the STI region.

FIG. 13 illustrates a cut-away view along the line A-A (of FIG. 12) of the substrate, the STI region, the inter-level dielectric layer, the sacrificial gate material the sacrificial gate cap, and the spacers arranged adjacent to the sacrificial gate material.

FIG. 14 illustrates a top view of the resultant structure following the formation of source/drain regions.

FIG. 15 illustrates a top view following the deposition of a second inter-level dielectric layer over the source/drain region (of FIG. 14).

FIG. 16 illustrates a cut-away view along the line B-B (of FIG. 15) of the sacrificial gate arranged over the fin and the second inter-level dielectric layer arranged over the source/drain regions.

FIG. 17 illustrates a top view of the resultant structure following the removal of the sacrificial gates (of FIG. 15) to form cavities that expose the channel regions of the fins.

FIG. 18 illustrates a cut-away view along the line A-A (of FIG. 17) of the cavity over the fin and partially defined by the spacers.

FIG. 19 illustrates a top view following the formation of a gate stack.

FIG. 20 illustrates a cut-away view along the line C-C (of FIG. 19) of the gate stack that includes the gate dielectric materials, the work function metal, and the gate conductor arranged over the fins.

FIG. 21 illustrates a side view following the formation of fins.

FIG. 22 illustrates a side view following the formation of the inter-level dielectric layer over portions of the relaxed second buffer layer.

FIG. 23 illustrates a side view following the formation of the first and second active regions on the relaxed second buffer layers.

FIG. 24 illustrates a side view following a planarization process such as, for example, chemical mechanical polishing that may be performed to reduce the thickness of the first and second active regions.

FIG. 25 illustrates a side view following the formation of a sacrificial gate, sacrificial gate cap, and spacers over the first and second active regions.

FIG. 26 illustrates a top view of the sacrificial gate arranged over the first and second active regions.

FIG. 27 illustrates a top view following the deposition of the inter-level dielectric layer as discussed above in FIG. 15 and a gate stack as discussed above in FIG. 19.

FIG. 28 illustrates a cut-away view along the line C-C (of FIG. 27) of the gate stack arranged on the first and second active regions.

DETAILED DESCRIPTION

Strain induced in the channel regions of semiconductor devices often improves the performance characteristics of the devices. In many complementary metal oxide semiconductor (CMOS) devices, a tensile strain is desired in the channel region of an n-type field effect transistor (FET) device (nFET) and a compressive strain is desired in the channel region of a p-type FET device (pFET). Strained channel regions often enhance electron mobility or hole mobility, which improves conductivity through the channel regions of FET devices.

Strain may be induced and modulated by, for example, epitaxially growing crystalline materials on a seed layer where the grown materials have different lattice constants than the seed layer. For example, when silicon is epitaxially grown on a relaxed layer of silicon germanium, a tensile strain is induced in the grown silicon material. Conversely, when a layer of silicon germanium is grown on a silicon seed layer, a compressive strain is induced in the grown layer of silicon germanium.

On thick layers of strained epitaxially grown materials, the strain on the materials is often not constant throughout the material. The region of the grown material that contacts the seed layer (lower region) is strained, but as the thickness of the grown material increases during the growth process, the strain relaxes in the regions that are spaced further from the seed layer (the upper regions). Thus, it is often challenging to modulate the strain on thick layers of epitaxially grown materials. Thick epitaxially grown materials are often more prone to having defects that may be induced during the growth process. In some devices, defects in the channel materials may be undesirable, and reduce the performance of the devices.

The methods and resultant structures described herein provide for forming a relaxed buffer layer that is relatively thin and substantially free from defects to induce a desired strain in channel regions of the resultant semiconductor devices that are formed on the buffer layer.

FIGS. 1-20 illustrate an exemplary method for forming semiconductor devices having strained material regions.

Figure 1:
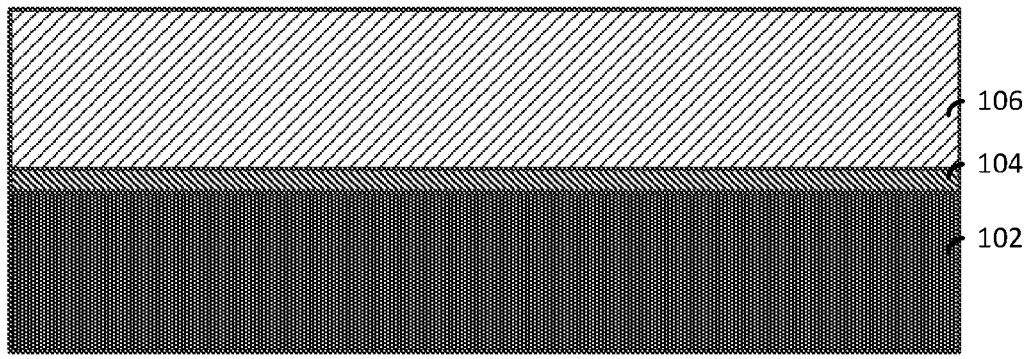
FIGS. 1-20 illustrate an exemplary method for forming semiconductor devices having strained material regions.

FIG. 1 illustrates a side view of a substrate 102 that is formed from a first semiconductor material. In the illustrated exemplary embodiment, the substrate 102 includes a bulk silicon material however; alternate embodiments may include a substrate 102 having another suitable type of semiconductor material. A first buffer layer 104 is deposited on the substrate 102. The first buffer layer 104 in the illustrated embodiment is epitaxially grown on the substrate 102 and has a thickness of about 2-10 nm. A strained second buffer layer 106 is deposed on the first buffer layer 104. The strained second buffer layer 106 is epitaxially grown and is relatively thicker than the first buffer layer and has a thickness of about 10-50 nm.

Epitaxial materials may be grown from gaseous or liquid precursors. Epitaxial materials may be grown using ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), vapor-phase epitaxy (VPE), molecular-beam epitaxy (MBE), liquid-phase epitaxy (LPE), or other suitable process, or other suitable processes.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

In the illustrated embodiment, the lattice constants of the first buffer layer 104 and the strained second buffer layer 106 are dissimilar, which induces a strain in the second buffer layer 106. The strain on the strained second buffer layer 106 will be relaxed in a subsequent process described below.

Figure 2:
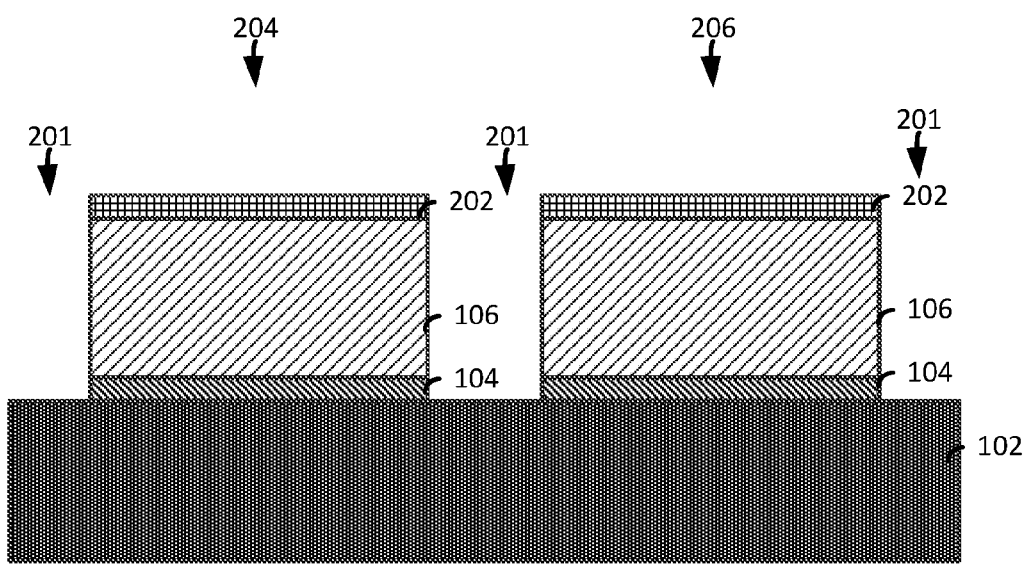

FIG. 2 illustrates a side view of the resultant structure following the formation of regions 204 and 206. The regions 204 and 206 are formed by, for example depositing an optional hardmask 202 over the strained second buffer layer 106 (of FIG. 1) and performing a lithographic patterning and etching process such as, for example, reactive ion etching that removes exposed portions of the hardmask 202, the underlying second buffer layer 106, and the first buffer layer 104 to expose portions of the substrate 102. The etching process forms trenches 201 that are partially defined by the substrate 102, the first buffer layer 104, and the second buffer layer 106. The hardmask 202 may include, for example, an oxide material, an nitride material, or any other suitable materials Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

In the illustrated embodiment, the substrate 102, the first buffer layer 104, the second buffer layer 106, and the hardmask layer 202 are formed from dissimilar materials having different melting points. The first buffer layer 104 has a lower melting point than the substrate 102 and the strained second buffer layer 106 (and the hardmask layer 202). In the illustrated exemplary embodiment, the substrate 102 is a silicon material having a melting point of about 1414° Celsius (C), the first buffer layer 104 is germanium (Ge) having a melting point of about 938° C., and the strained second buffer layer 106 is silicon germanium (SiGe) having with a concentration of about 20% germanium (SiGe20), which has a melting point of about 1236° C. (at standard pressure).

Though the illustrated exemplary embodiment includes an Si substrate 102, a Ge first buffer layer 104, and a SiGe20) second buffer layer 106, alternate embodiments may include any suitable crystalline materials where the melting point of the first buffer layer 104 is lower than the melting point of the substrate 102 and the second buffer layer 106.

Figure 3:
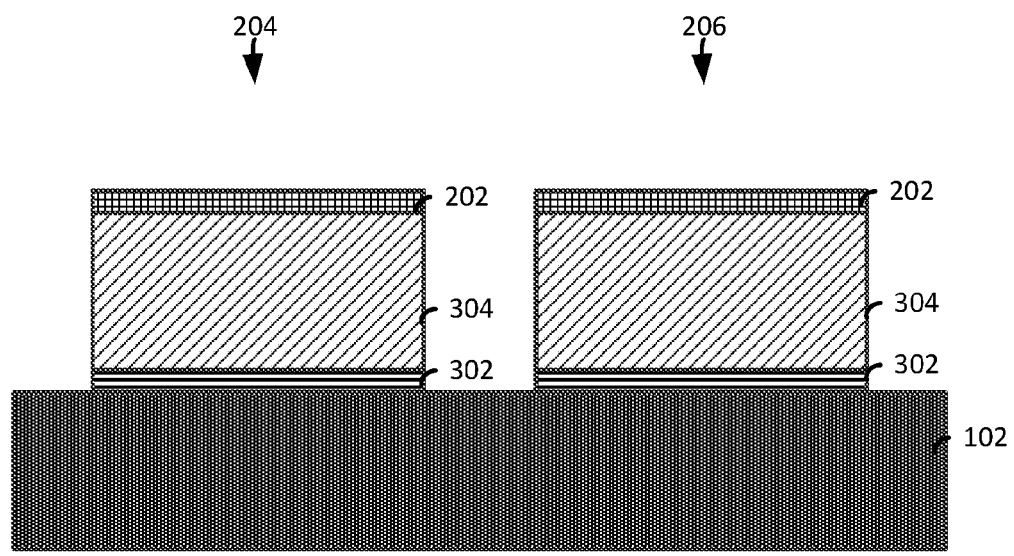

FIG. 3 illustrates a side view of the resultant structure following an annealing process, such as, for example, laser annealing that is performed at a temperature greater than the melting point of the first buffer layer 104 (of FIG. 2) and less than the melting points of the substrate 102 and the strained second buffer layer 106 (and the hardmask layer 202 if present).

The when the temperature of the first buffer layer 104 exceeds the melting point, the first buffer layer 104 (of FIG. 2) liquefies resulting in the liquefied first buffer layer 302 (of FIG. 3). When the liquefied first buffer layer 302 is formed, the strain in the second buffer layer 104 (of FIG. 2) is relaxed resulting in a relaxed second buffer layer 304. The reflow of the liquefied first buffer layer 302 relaxes the strain resulting in the relaxed second buffer layer 304.

In previous methods, forming a relaxed buffer layer often included growing a relatively thick buffer layer on a substrate such that the strain was relaxed in the top or upper regions of the buffer layer. The growth process to form such a relatively thick buffer layer often resulted in a buffer layer with undesirable defects that may degrade the performance of semiconductor devices subsequently formed on the thick buffer layer.

Figure 4:
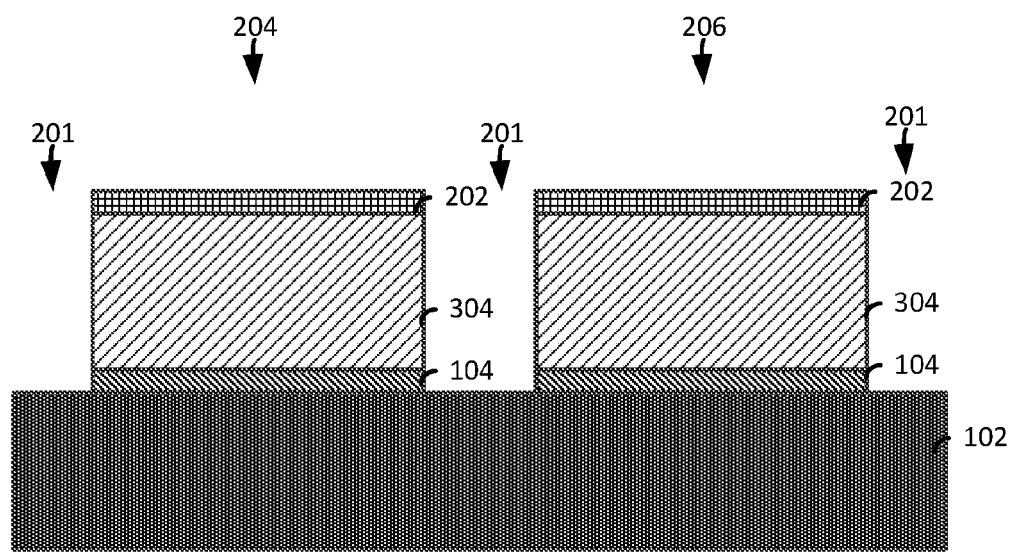

FIG. 4 illustrates a side view after the annealing process where the first buffer layer 304 (of FIG. 3) has cooled below the melting point of the first buffer layer 304 and returned to a solid state resulting in the first buffer layer 104. The relaxed second buffer layer 304 remains in a substantially relaxed state.

Figure 5:
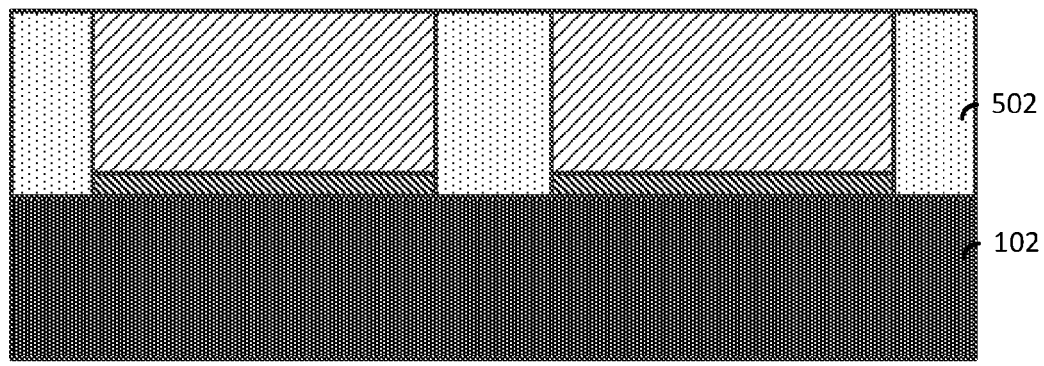

FIG. 5 illustrates a side view of the resulting structure following the formation of a shallow trench isolation (STI) (isolation) region 502. The STI region 502 may be formed by, any suitable process including, filling the trenches 201 (of FIG. 4) with an insulating material, such as silicon dioxide.

In the illustrated embodiment, at least one isolation region is a shallow trench isolation region ("STI"). However, the isolation region 502 may be a trench isolation region, a field oxide isolation region (not shown), or any other type of isolation region. The isolation region 502 provides isolation between neighboring device regions. For example, the isolation region 502 may be used when the neighboring gates have opposite conductivities, e.g., nFETs and pFETs. As such, the isolation region 502 separates an nFET device region from a pFET device region.

Following the formation of the isolation region 502, a planarization process such as, for example, chemical mechanical polishing (CMP) may be performed to remove overburdened isolation material and the hardmask 202 (of FIG. 4). Alternatively, a suitable selective etching process may be performed to remove the hardmask 202 and the isolation material to form the isolation regions 502.

Figure 6:
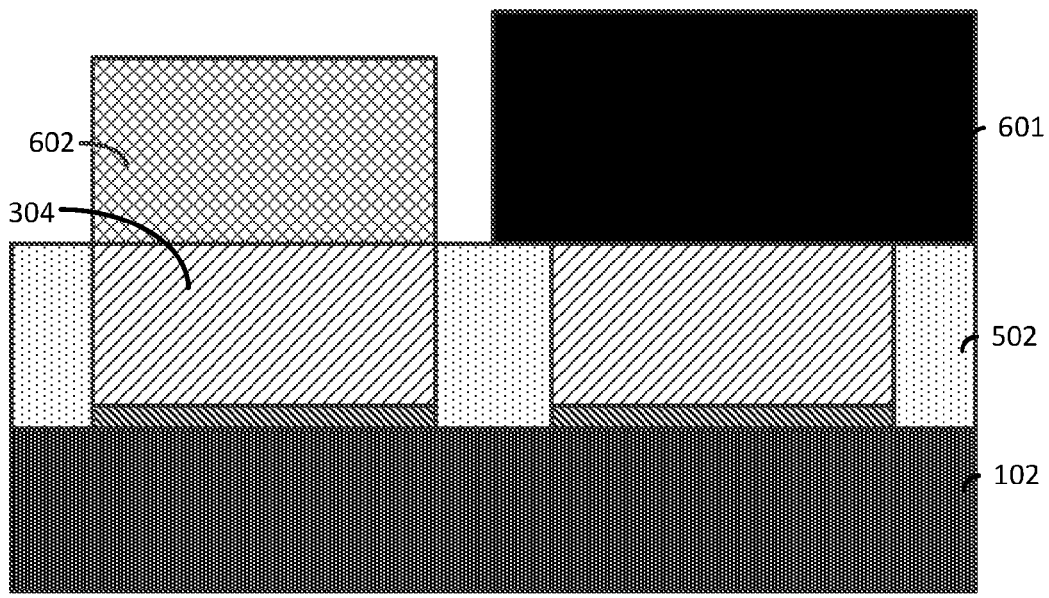

FIG. 6 illustrates a side view following the formation of a mask 601 over the region 206 and the formation of a first active region 602 in the region 204. Suitable masks 601 include a hardmask material such as silicon nitride. The hardmask 601 may be formed by deposition followed by patterning such as lithography and etch. The first active region 602 is formed by, for example, an epitaxial growth process as described above, that grows crystalline material on exposed portions of the strained second buffer layer 304 in the first region 204.

Figure 7:
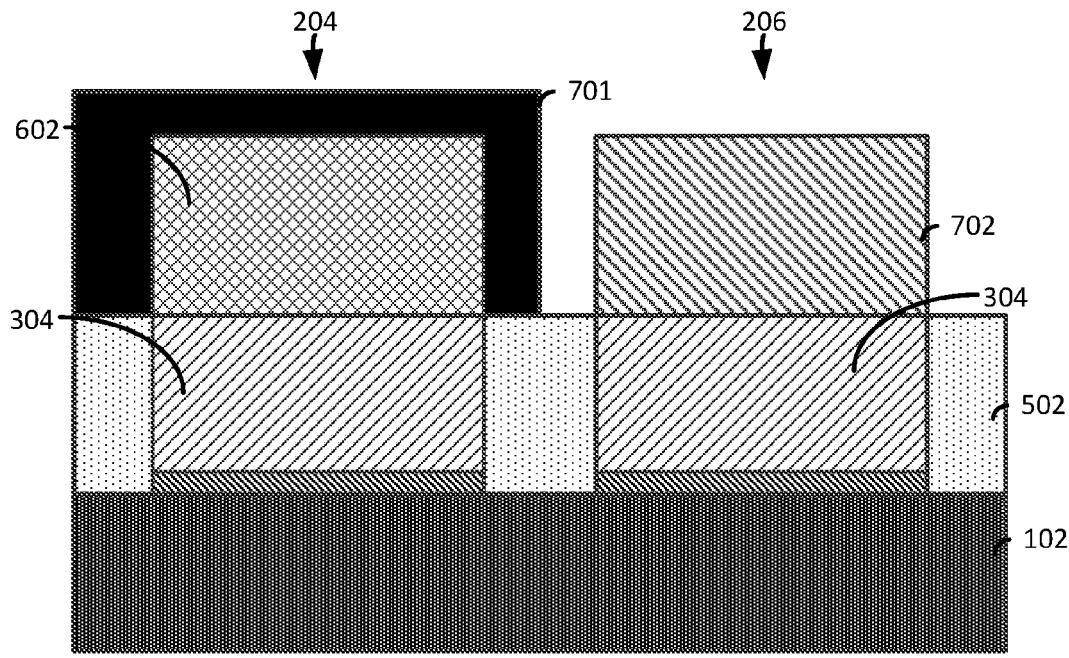

FIG. 7 illustrates a side view following the removal of the mask 601 (of FIG. 6) and the formation of a second mask 701 over the first active region 602. The mask 601 may be removed by a suitable process such as, for example, an aqueous etch solution containing hot phosphoric acid to remove silicon nitride.

Following the removal of the mask 601 and the formation of the second mask 701, a second active region 702 is formed in the second region 206. The second active region 702 may be formed by, for example, an epitaxial growth process similar to the process described above that grows a crystalline material on exposed portions of the relaxed second buffer layer 304 in the second region 206.

Following the formation of the second active region 702 the second mask 701 may be removed by a suitable process such as, for example, ashing as described above.

In the illustrated exemplary embodiment, the first active region 602 and the second active region are formed from dissimilar materials. In one exemplary embodiment, the first active region 602 includes crystalline silicon. Where the relaxed second buffer layer 304 is SiGe, a tensile strain is induced in the first active region 602. The second active region 702 may include, for example, crystalline SiGe having a germanium concentration greater than the SiGe in the relaxed second buffer layer 304 (e.g., SiGe40 (silicon germanium with an atomic concentration of about 40% of germanium) where the relaxed second buffer layer 304 includes SiGe20 (silicon germanium with an atomic concentration of about 20% of germanium)). In such an embodiment, the second active region 702 is compressively strained.

Figure 8:
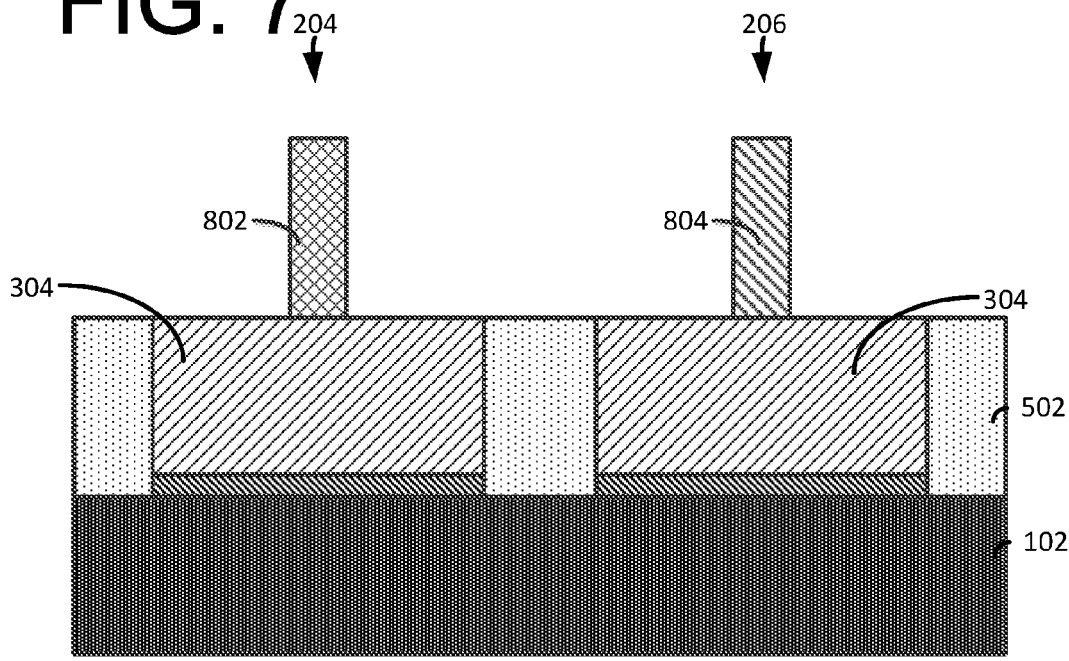

FIG. 8 illustrates a side view following the formation of fins 802 and 804 by removing portions of the first active region 602 and the second active region 702. The fins 802 and 804 may be patterned by, for example, a lithographic patterning and etching process such as, reactive ion etching (RIE) or a sidewall imaging transfer process that removes exposed portions of the first active region 602 (of FIG. 7) and the second active region 702 to expose portions of the relaxed second buffer layer 304 and form the fins 802 and 804.

Figure 9:
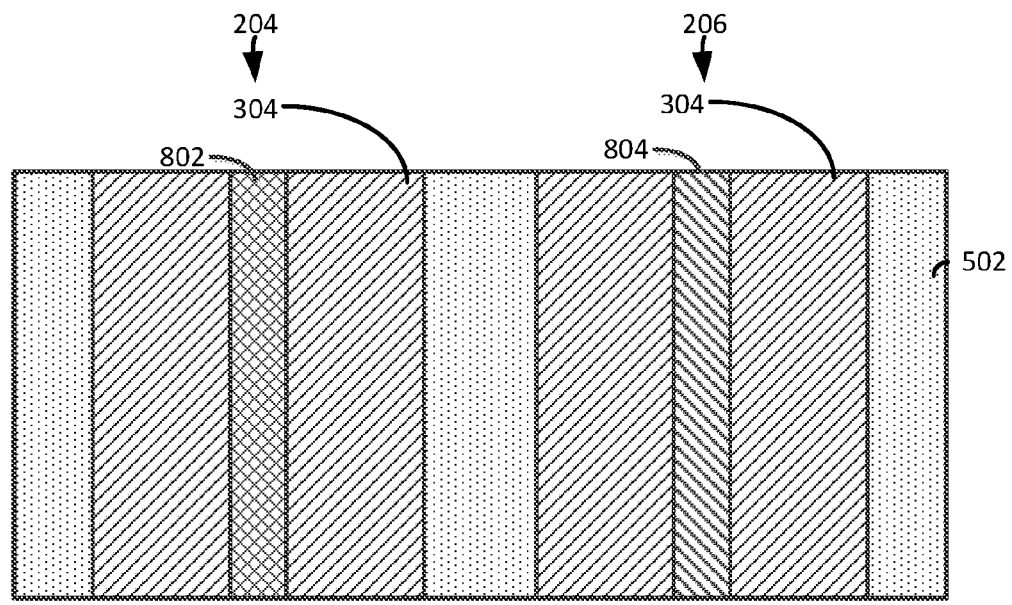

FIG. 9 illustrates a top view of the fins 802 and 804 arranged on the relaxed second buffer layers 304.

Figure 10:
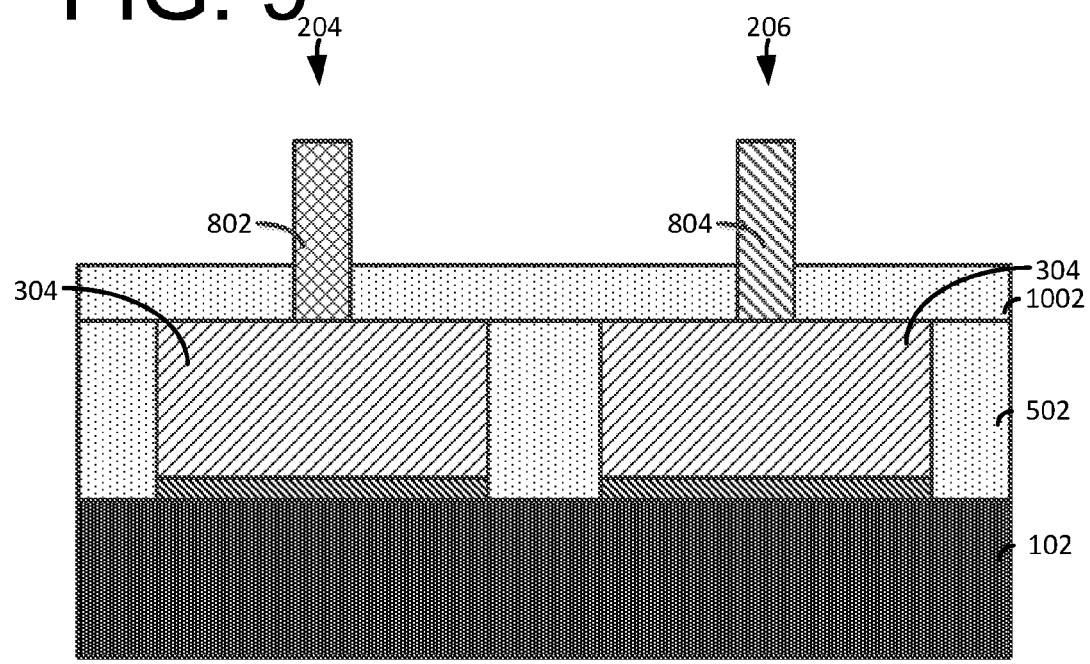

FIG. 10 illustrates a side view following the formation of an inter-level dielectric layer 1002 over exposed portions of the STI region 502 and the relaxed second buffer layer 304.

The inter-level dielectric layer 1002 is formed from, for example, a low-k dielectric material (with k<4.0), including but not limited to, silicon oxide, spin-on-glass, a flowable oxide, a high density plasma oxide, or any combination thereof. The inter-level dielectric layer 1002 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1002, an etching process may be performed to expose portions of the fins 802 and 804.

Figure 11:
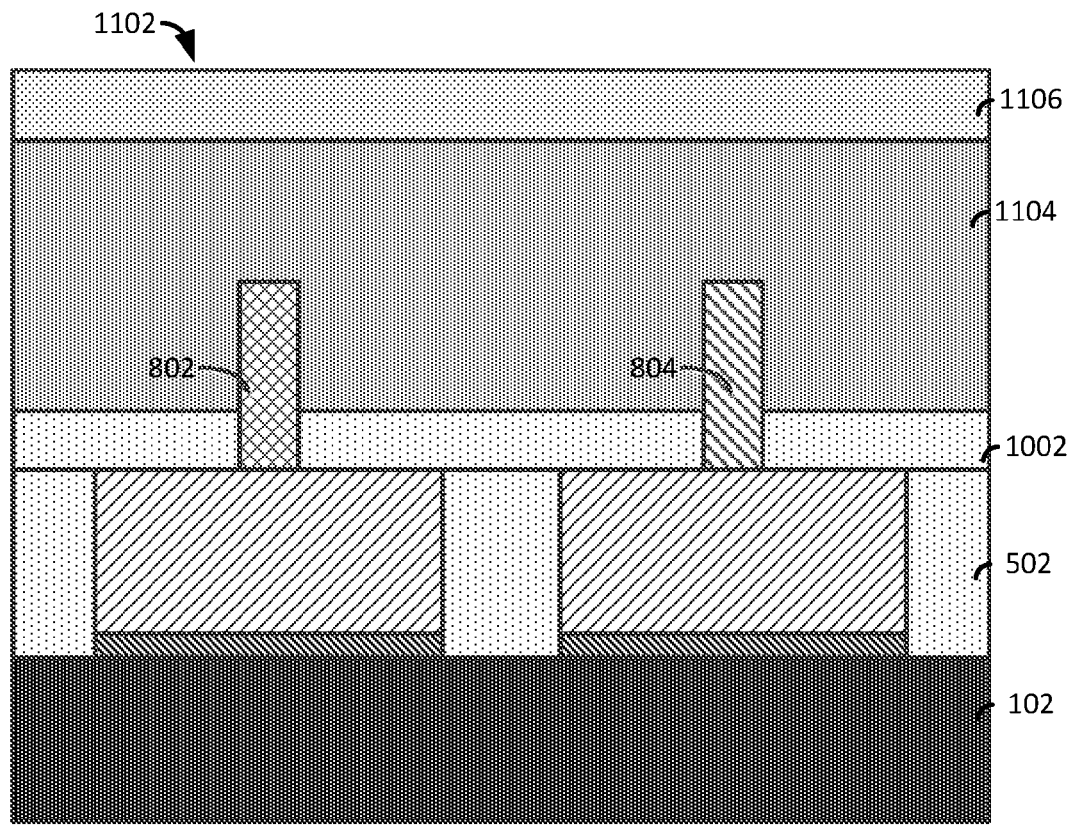

FIG. 11 illustrates a side view of the resultant structure following the formation of sacrificial (dummy) gates 1102 over portions of the fins 802 and 804. The sacrificial gates 1102 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 1102 may further comprises a sacrificial gate dielectric material such as silicon oxide between the nanowires and aSi or polysilicon material.

The layer sacrificial gate material may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 1106. The hardmask layer may be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gates 1102 and the sacrificial gate caps 1106.

In FIG. 11, spacers 1104 are formed adjacent to the sacrificial gates 1102. The spacers 1104 in the illustrated embodiment are formed by depositing a layer of spacer material (not shown) over the exposed portions of the shallow trench isolation region 502, the fins 802 and 804, and the sacrificial gates 1102. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 1104.

Figure 12:
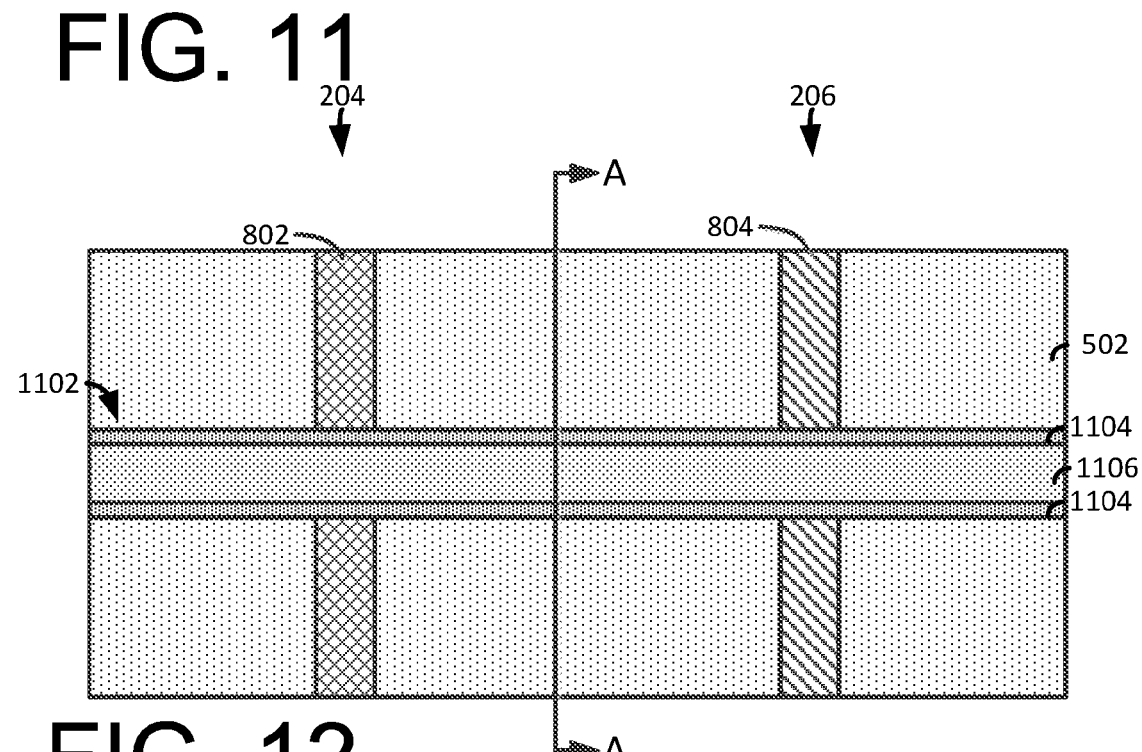

FIG. 12 illustrates a top view of the sacrificial gate 1102 and spacers 1104 arranged over the fins 802 and 804 and the STI region 502.

Figure 13:
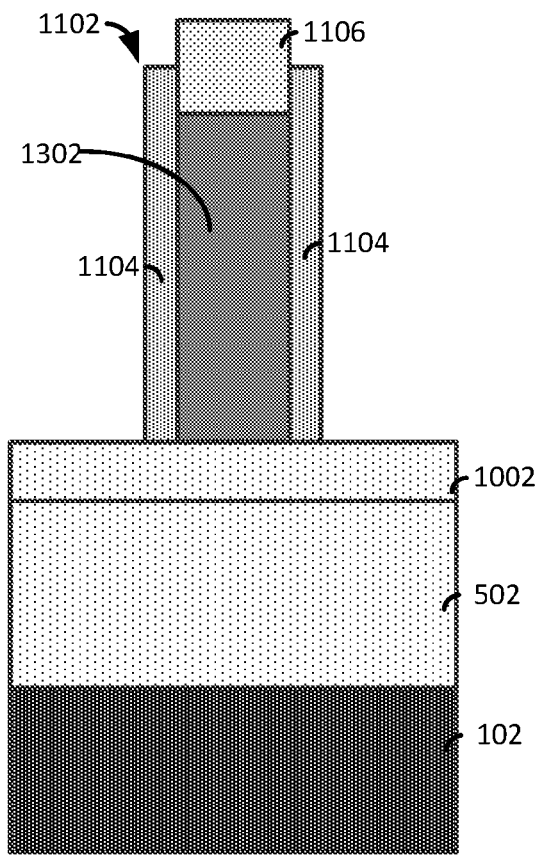

FIG. 13 illustrates a cut-away view along the line A-A (of FIG. 12) of the substrate 102, the STI region 502, the inter-level dielectric layer 1002, the sacrificial gate material 1302 the sacrificial gate cap 1106, and the spacers 1104 arranged adjacent to the sacrificial gate material 1302.

Figure 14:
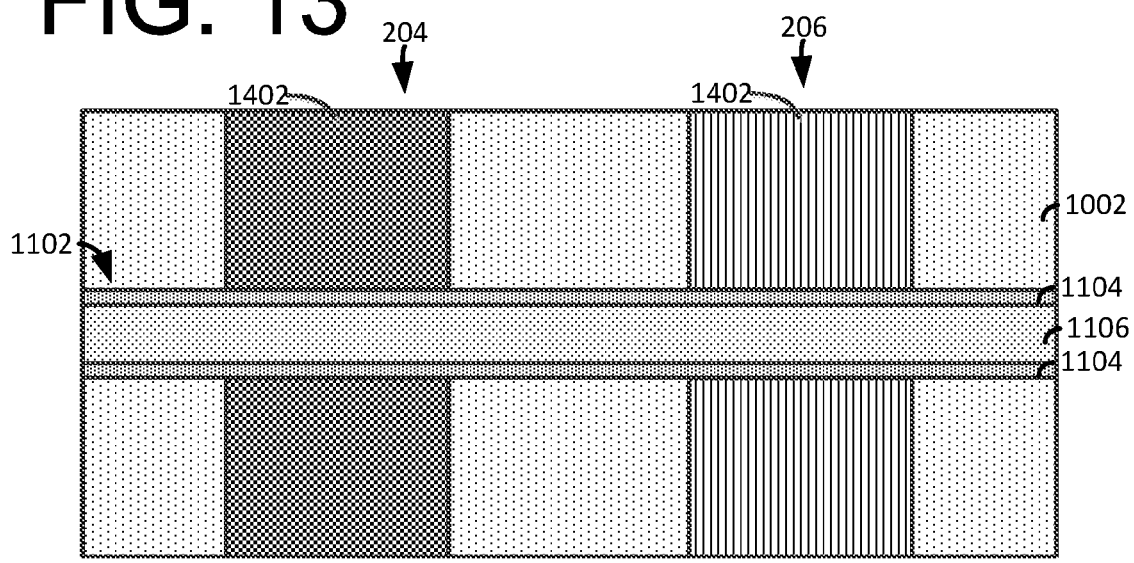

FIG. 14 illustrates a top view of the resultant structure following the formation of source/drain regions 1402. The source/drain regions 1402 are formed by an epitaxial growth process that deposits a crystalline over layer of semiconductor material onto the exposed crystalline seed material of the exposed fins 802 and 804 to form the source/drain regions 1402.

Epitaxial materials may be grown from gaseous or liquid precursors. Epitaxial materials may be grown using ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ to $1 \times 10^{21}$ cm$^{-3}$.

Figure 15:
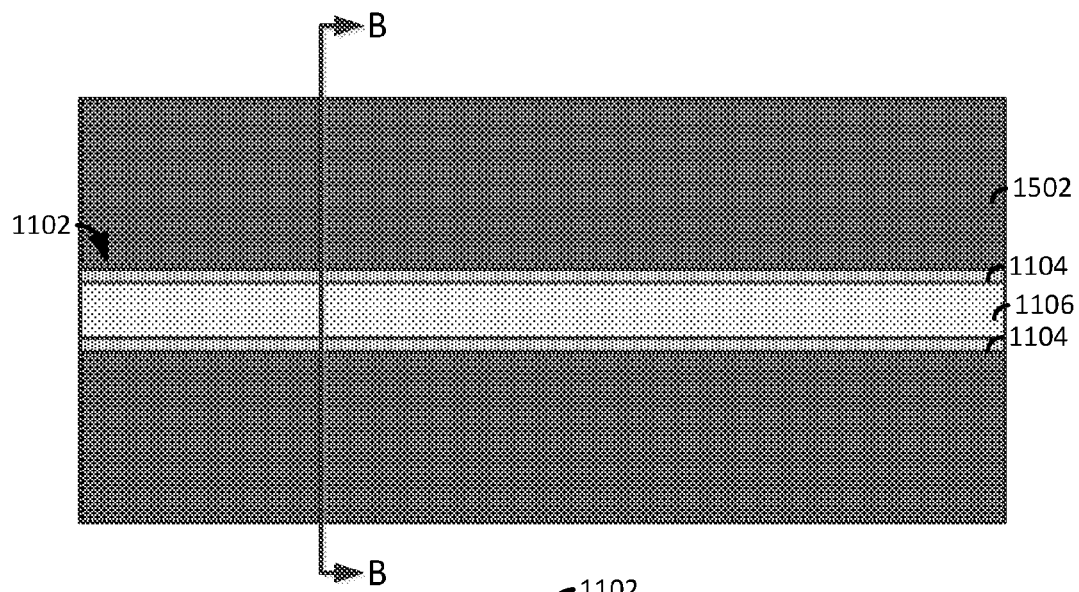

FIG. 15 illustrates a top view following the deposition of a second inter-level dielectric layer 1502 over the source/drain region 1402 (of FIG. 14). Following the deposition of the second inter-level dielectric layer 1502, a planarization process such as, for example, chemical mechanical polishing may be performed to expose portions of the sacrificial gate 1102.

Figure 16:
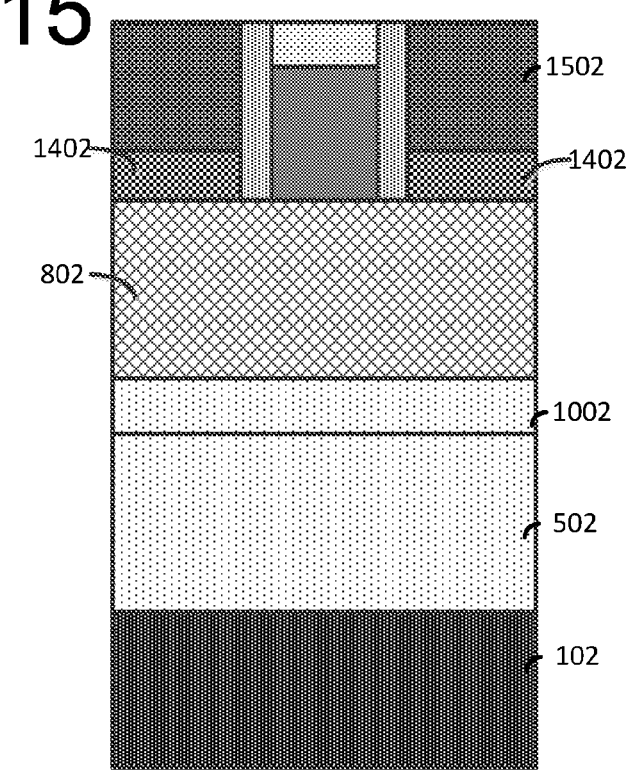

FIG. 16 illustrates a cut-away view along the line B-B (of FIG. 15) of the sacrificial gate 1102 arranged over the fin 802 and the second inter-level dielectric layer 1502 arranged over the source/drain regions 1402.

Figure 17:
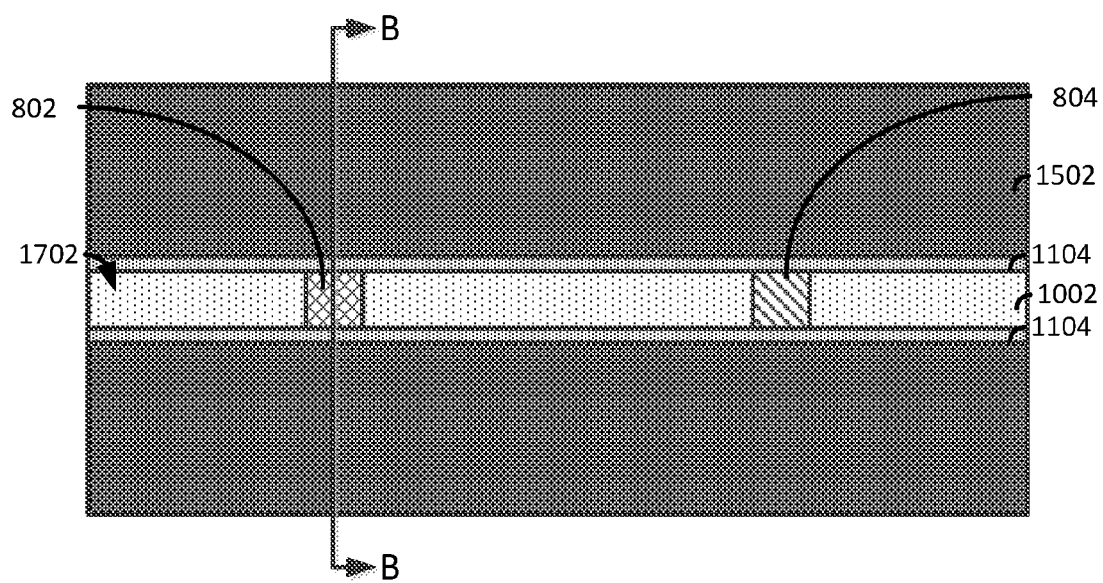

FIG. 17 illustrates a top view of the resultant structure following the removal of the sacrificial gates 1102 (of FIG. 15) to form cavities 1702 that expose the channel regions of the fins 802 and 804. The sacrificial gates 1102 may be removed by performing a dry etch process, for example, ME, followed by a wet etch process. The wet etch process is selective to (will not substantially etch) the spacers 1104 and the second inter-level dielectric layer 1502. The chemical etch process may include, but is not limited to, hot ammonia or tetramethylammonium hydroxide (TMAH).

Figure 18:
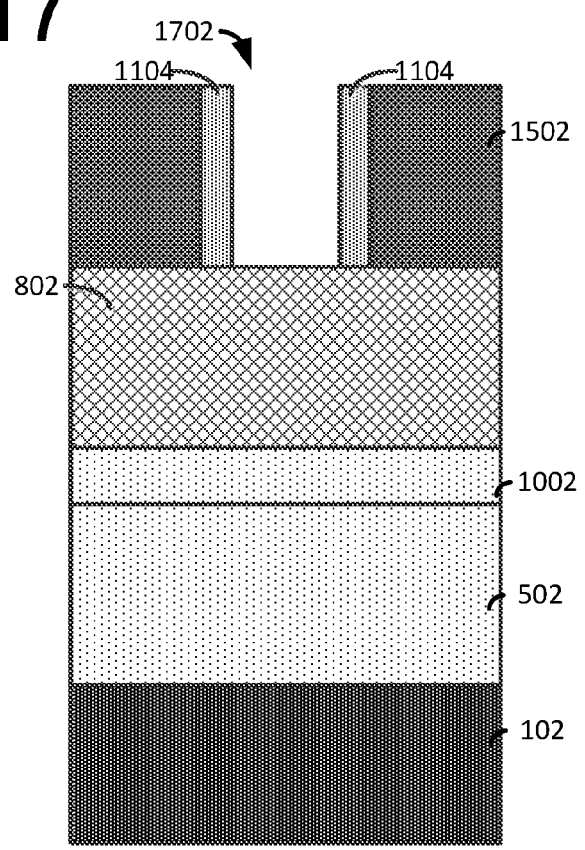

FIG. 18 illustrates a cut-away view along the line A-A (of FIG. 17) of the cavity 1702 over the fin 802 and partially defined by the spacers 1104.

Figure 19:
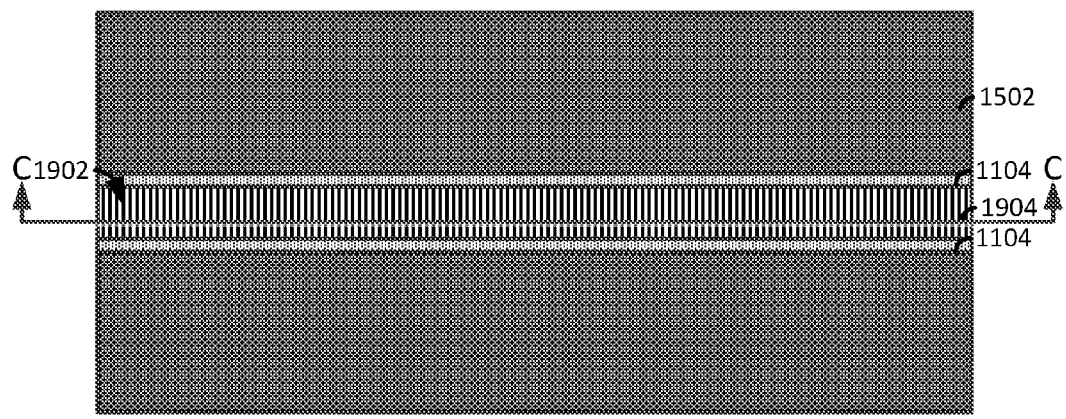

FIG. 19 illustrates a top view following the formation of a gate stack 1902. The gate stack 1902 includes high-k metal gates formed, for example, by filling the cavity 1702 (of FIG. 17) with one or more dielectric materials 2002 (of FIG. 20), one or more workfunction metals 2004, and one or more metal gate conductor 1904 materials. The gate dielectric material(s) 2002 can be a dielectric material having a dielectric constant greater than 3.9, 7.0, or 10.0. Non-limiting examples of suitable materials for the dielectric materials 2002 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric materials 2002 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 2004 may be disposed over the gate dielectric material 2002. The type of work function metal(s) 2004 depends on the type of transistor and may differ between the nFET and pFET devices. Non-limiting examples of suitable work function metals 2004 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor material(s) 1904 is deposited over the gate dielectric materials 2002 and work function metal(s) 2004 to form the gate stacks 1902. Non-limiting examples of suitable conductive metals include aluminum (Al), platinum (Pt), gold (Au), tungsten (W), titanium (Ti), or any combination thereof. The gate conductor material(s) 1904 may be deposited by a suitable deposition process, for example, CVD, PECVD, PVD, plating, thermal or e-beam evaporation, and sputtering.

Following the deposition of the gate dielectric materials 2002, the work function metal(s) 2004, and the gate conductor material(s) 1904, planarization process, for example, chemical mechanical planarization (CMP), is performed to remove the overburden of the deposited gate materials and form the gate stack 1902.

Figure 20:
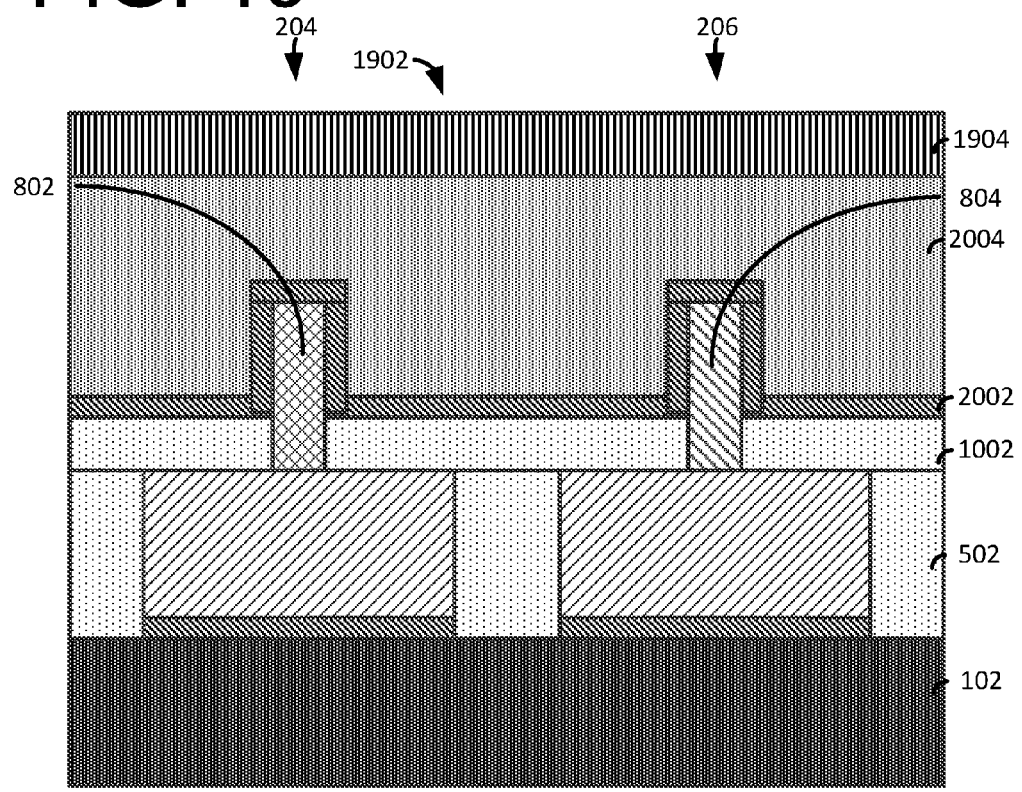

FIG. 20 illustrates a cut-away view along the line C-C (of FIG. 19) of the gate stack 1902 that includes the gate dielectric materials 2002, the work function metal 2004, and the gate conductor 1904 arranged over the fins 802 and 804.

The illustrated exemplary embodiments described above provide for a relatively thin relaxed buffer layer (relaxed second buffer layer 304) with substantially reduced material defects such that strained active regions may be formed on the relaxed buffer layer without degradation due to defects in the relaxed buffer layer.

After the gate stack 1902 is formed, additional insulating material (not shown) may be deposited over the device(s). The insulating material may be patterned to form cavities (not shown) that expose portions of the source/drain region 1402 and the gate stack 1902. The cavities may be filled by a conductive material (not shown) and, in some embodiments, a liner layer (not shown) to form conductive contacts (not shown).

Figure 21:
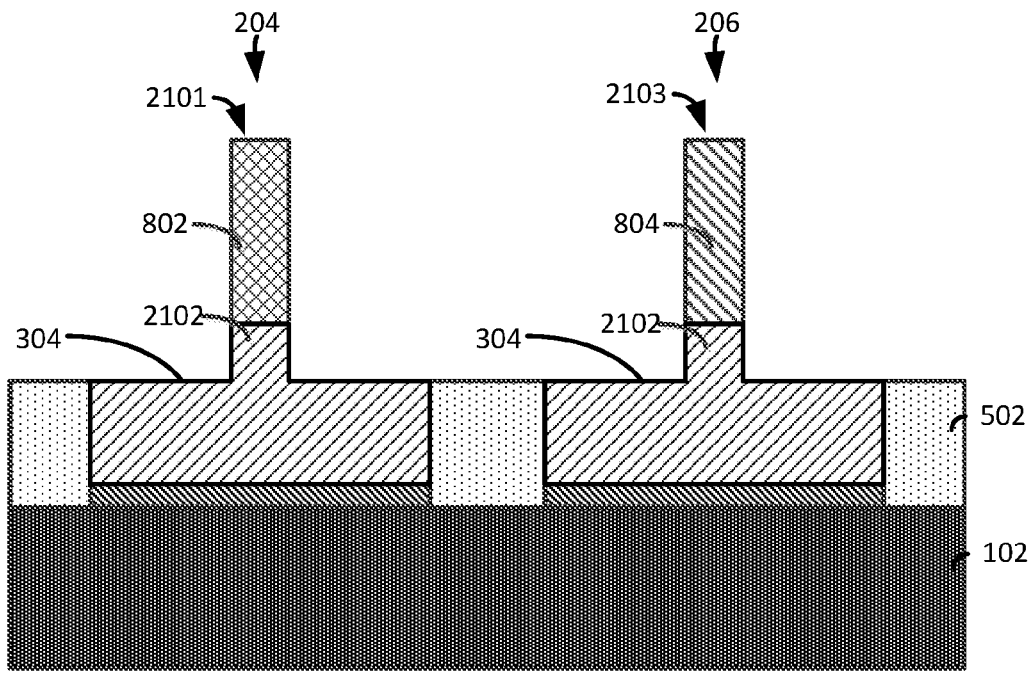
FIGS. 21-22 illustrate an alternate exemplary method for forming a finFET device with a relatively thin relaxed buffer layer.
Figure 22:
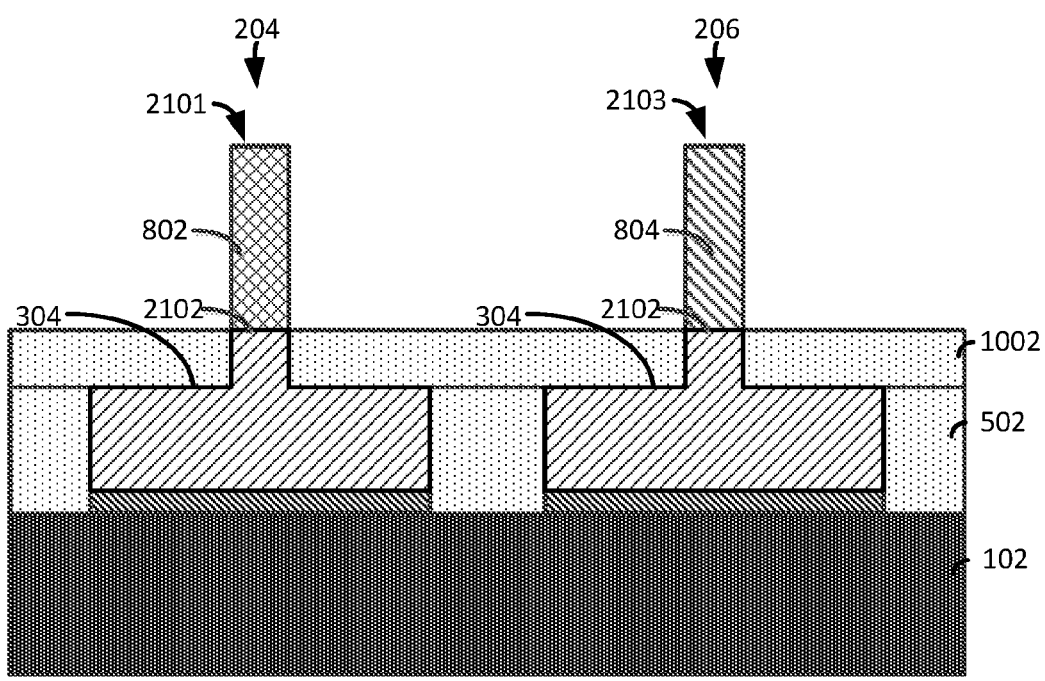

FIGS. 21-22 illustrate an alternate exemplary method for forming a finFET device with a relatively thin relaxed buffer layer.

FIG. 21 illustrates a side view following the formation of fins 2101 and 2103. The fins 2101 and 2103 are formed following a similar process described above in FIGS. 1-7. Following the formation of the first and second active regions 602 and 702 and the removal of the second mask 701 (of FIG. 7), a lithographic patterning and etching process is performed to remove exposed portions of the first and second active regions 602 and 702 and portions of the relaxed second buffer layer 304 to form the fins 2101 and 2103 that include a portion 2102 of the relaxed second buffer layer 304.

The formation of the fins 2101 and 2103 is similar to the formation of the fins 802 and 802 described above however; the etching process that forms the fins 802 and 804 by removing exposed portions of the first and second active regions 602 and 702 also removes exposed portions of the relaxed second buffer layer 304.

FIG. 22 illustrates a side view following the formation of the inter-level dielectric layer 1002 over portions of the relaxed second buffer layer 304 in a similar manner as discussed above. Following the formation of the inter-level dielectric layer 1002 (in FIG. 22), gate stacks may be formed using a similar process as described above in FIGS. 11-20.

FIGS. 23-28 illustrate the formation of a planar FET device with a relatively thin relaxed buffer layer.

Figure 23:
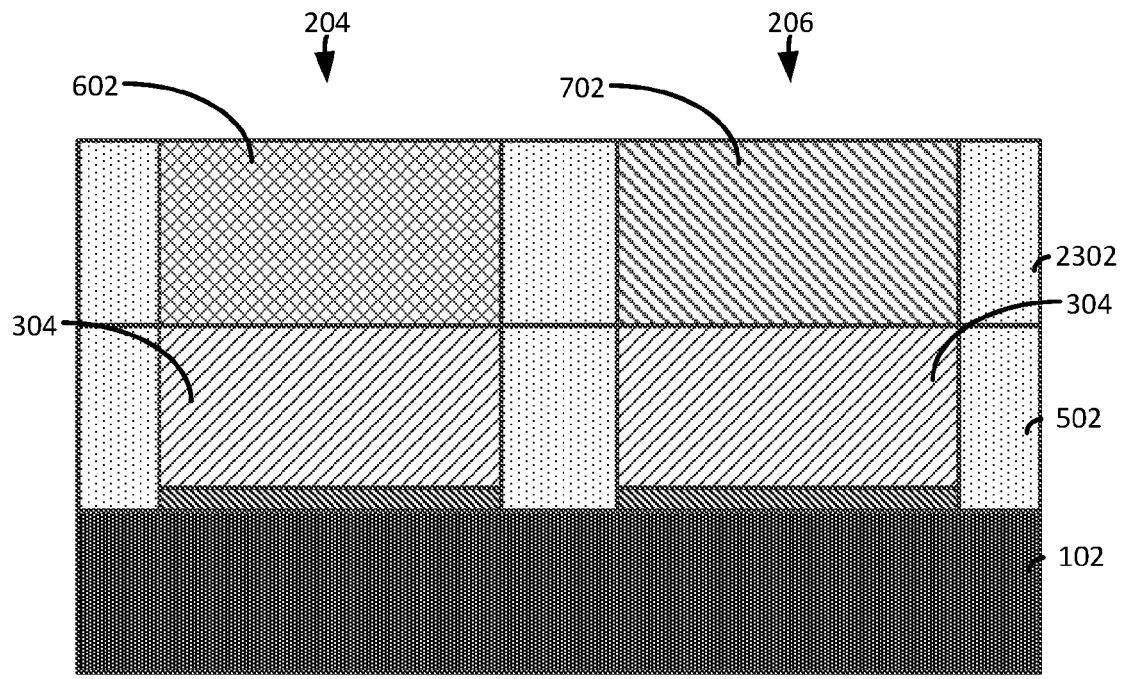
FIGS. 23-28 illustrate the formation of a planar FET device with a relatively thin relaxed buffer layer.

FIG. 23 illustrates a side view following the formation of the first and second active regions 602 and 702 on the relaxed second buffer layers 304 using a similar process as described above in FIGS. 1-7.

In this regard, following the formation of the first and second active regions 602 and 702, a second shallow trench isolation (STI) region 2302 is formed adjacent to the first and second active regions 602 and 702.

Figure 24:
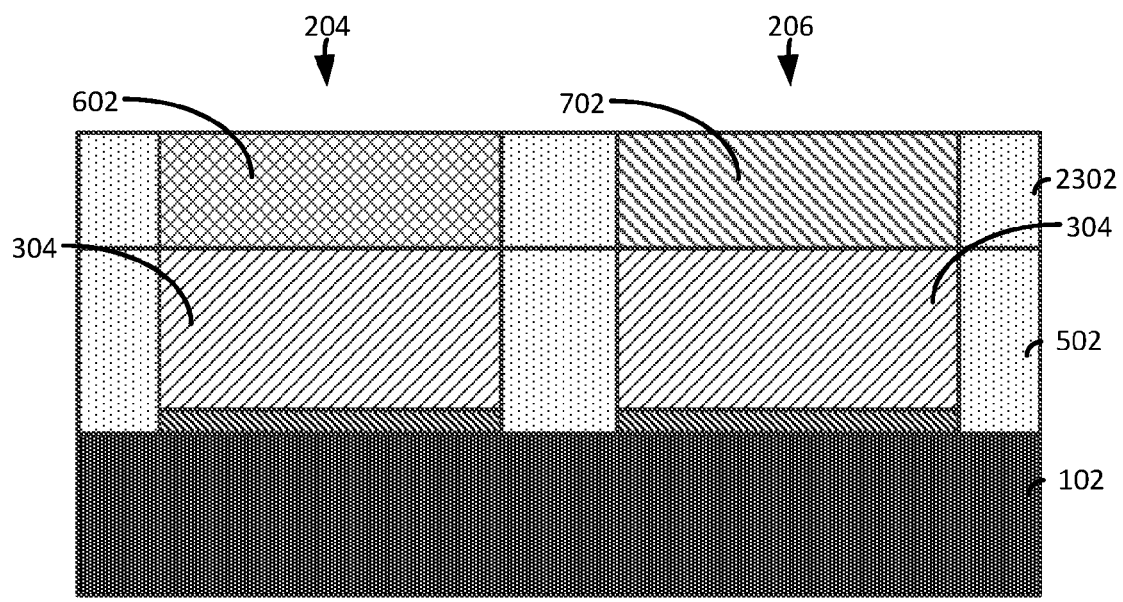

FIG. 24 illustrates a side view following a planarization process such as, for example, chemical mechanical polishing that may be performed to reduce the thickness of the first and second active regions 602 and 702.

Figure 25:
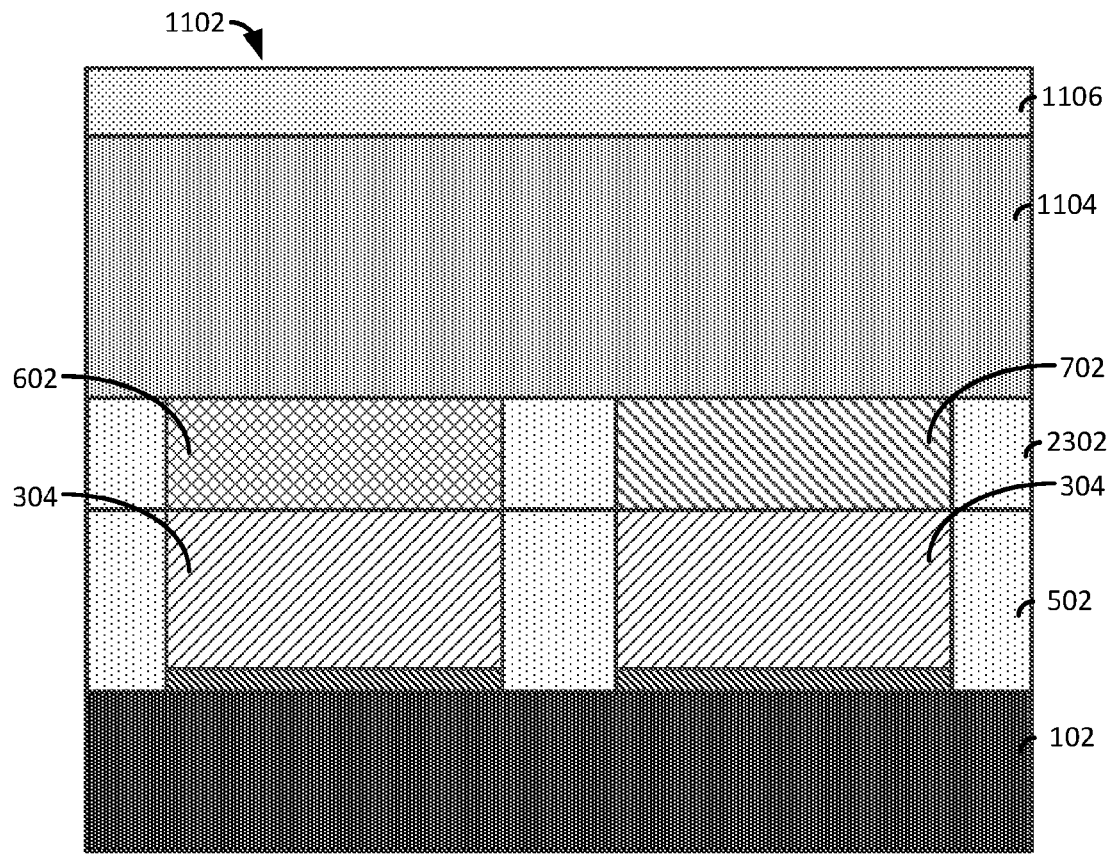

FIG. 25 illustrates a side view following the formation of a sacrificial gate 1102, sacrificial gate cap 1106, and spacers 1104 over the first and second active regions 602 and 702, using a similar process as described above in FIG. 11.

Figure 26:
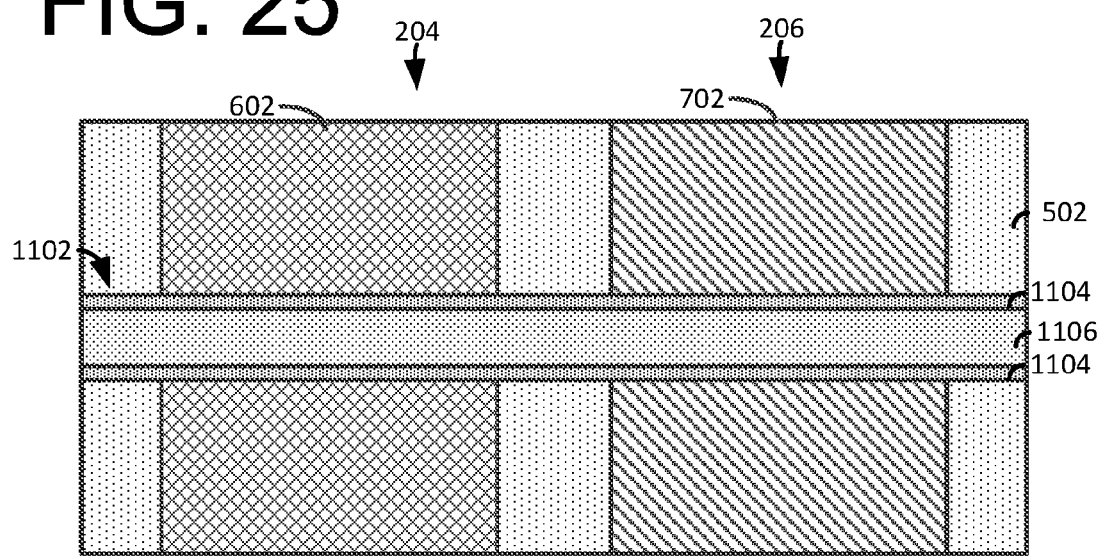

FIG. 26 illustrates a top view of the sacrificial gate 1102 arranged over the first and second active regions 602 and 702. Following the formation of the sacrificial gate 1102, the exposed portions of the first and second active regions 602 and 702 may be doped by, for example, an ion implantation and annealing process to form source/drain regions (not shown). Alternatively, an epitaxial growth process may be performed to form source/drain regions that may be doped in-situ during the epitaxial growth process or using an ion implantation process.

Figure 27:
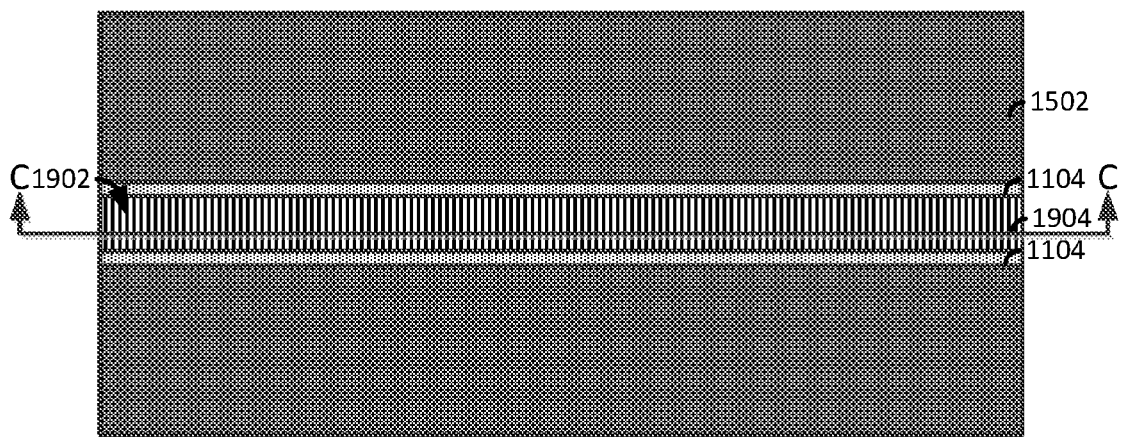

FIG. 27 illustrates a top view following the deposition of the inter-level dielectric layer 1502 as discussed above in FIG. 15 and a gate stack 1902 as discussed above in FIG. 19.

Figure 28:
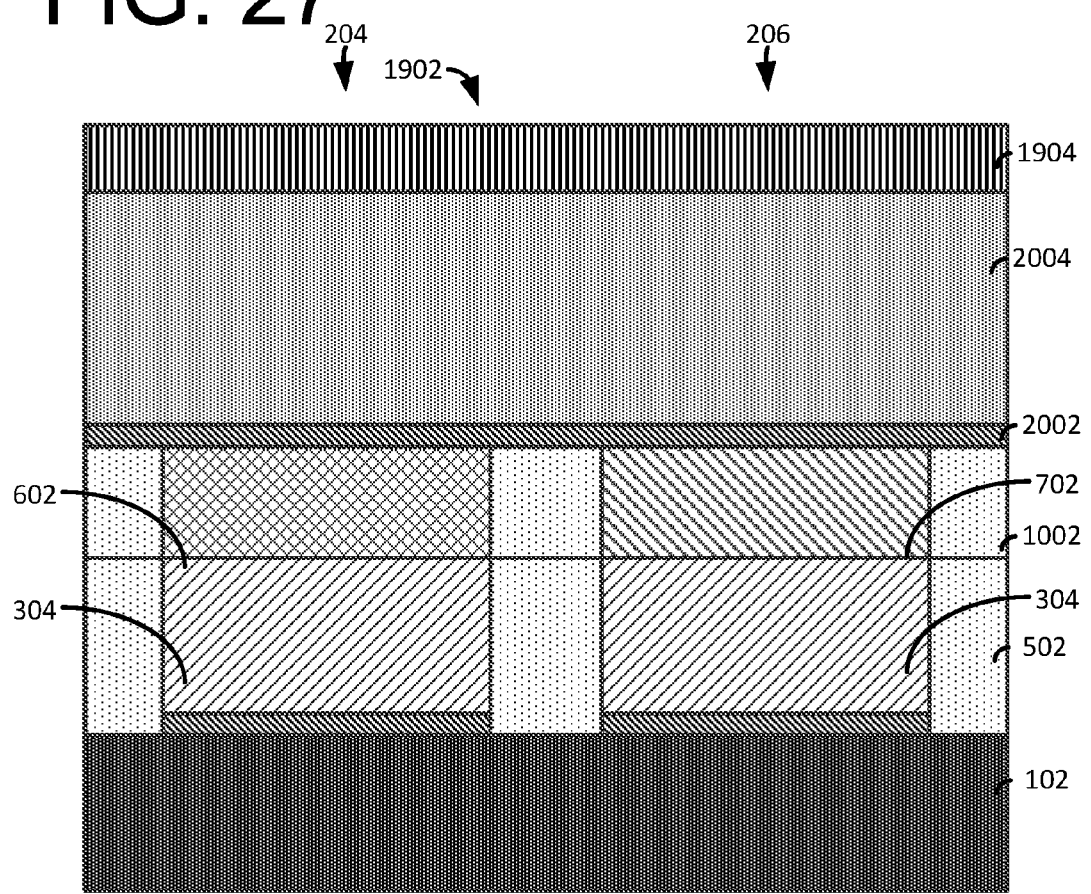

FIG. 28 illustrates a cut-away view along the line C-C (of FIG. 27) of the gate stack 1902 arranged on the first and second active regions 602 and 702. The gate stack 1902 includes the gate dielectric 2002, the workfunction metal 2004 and the gate conductor 1904.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
   forming a first buffer layer on a substrate, the first buffer layer having a first melting point; forming a second buffer layer on the first buffer layer, the second buffer layer having a second melting point, the second melting point greater than the first melting point; performing an annealing process that increases a temperature of the first buffer layer such that the first buffer layer partially liquefies and causes a strain in the second buffer layer to substantially be reduced; wherein the annealing process increases the temperature of the first buffer layer such that the temperature is at least equal to the first melting point and less than the second melting point;
   cooling the first buffer layer below the first melting point;
   forming a layer of a first semiconductor material on the second buffer layer; and
   forming a gate stack on the first semiconductor material.

2. The method of claim 1, further comprising removing a portion of the second buffer layer and the first buffer layer to expose a portion of the substrate and form a first portion of the second buffer layer and a second portion of the second buffer layer prior to performing the annealing process, wherein the layer of the first semiconductor material is formed on the first portion of the second buffer layer.

3. The method of claim 2, further comprising forming a layer of a second semiconductor material on the second portion of the second buffer layer following the forming the layer of the first semiconductor material.

4. The method of claim 1, wherein the second buffer layer includes a first crystalline material.

5. The method of claim 1, wherein the first buffer layer includes a second crystalline material.

6. A method for forming an active region of a semiconductor device, the method comprising:

forming a first buffer layer on a substrate, the first buffer layer having a first melting point;

forming a second buffer layer on the first buffer layer, the second buffer layer having a second melting point, the second melting point greater than the first melting point; and performing an annealing process that increases a temperature of the first buffer layer such that the first buffer layer partially liquefies and causes a strain in the second buffer layer to substantially be reduced; wherein the annealing process increases the temperature of the first buffer layer such that the temperature is at least equal to the first melting point and less than the second melting point.

7. The method of claim 6, further comprising:

cooling the first buffer layer below the first melting point; and forming a layer of a first semiconductor material on a first portion of the second buffer layer.

8. The method of claim 7, further comprising forming a layer of a second semiconductor material on a second portion of the second buffer layer.

9. The method of claim 6, wherein the second buffer layer includes a first crystalline material.

10. The method of claim 6, wherein the first buffer layer includes a second crystalline material.

11. The method of claim 6, wherein the first buffer layer is formed on the substrate by an epitaxial growth process.

12. The method of claim 6, wherein the second buffer layer is formed on the first buffer layer by an epitaxial growth process.

13. The method of claim 6, further comprising forming a hardmask layer on the second buffer layer prior to performing the annealing process.

14. The method of claim 6, wherein the first buffer layer includes germanium and the second buffer layer includes silicon germanium.

15. The method of claim 6, further comprising removing a portion of the second buffer layer and the first buffer layer to expose a portion of the substrate prior to performing the annealing process.

* * * * *